United States Patent [19]

Karl

[11] Patent Number: 4,651,440

[45] Date of Patent: Mar. 24, 1987

[54] SPIN DRYING APPARATUS

[75] Inventor: Gerald M. Karl, Ontario, N.Y.

[73] Assignee: Eastman Kodak Company, Rochester, N.Y.

[21] Appl. No.: 864,634

[22] Filed: May 16, 1986

[51] Int. Cl.[4] .................................. F26B 11/08
[52] U.S. Cl. .................................. 34/58; 34/8; 34/239; 294/115
[58] Field of Search .......... 34/8, 36, 58, 187, 236, 34/239; 294/115, 116

[56] References Cited

U.S. PATENT DOCUMENTS

| | | | |
|---|---|---|---|
| 3,152,875 | 10/1964 | Davis et al. | 34/58 |
| 4,134,215 | 1/1979 | Kuhl | 34/8 |
| 4,313,266 | 2/1982 | Tam | 34/8 |

OTHER PUBLICATIONS

IBM Technical Disclosure Bulletin vol. 18, No. 6, pp. 1979-1980, Nov. 1975.

Primary Examiner—Albert J. Makay
Assistant Examiner—David W. Westphal
Attorney, Agent, or Firm—Robert L. Randall

[57] ABSTRACT

A spin drying apparatus for drying semiconductor wafers wherein the wafers are contacted only at the edge thereof by a plurality of radially extending arms and wherein means is provided for preventing the generation of turbulent air flow by the fan-like effect of the rotation of the arms during the spin drying step and the recontamination of already cleaned and dried wafer surfaces by contaminants stirred up by the operation of the spin drying apparatus itself.

9 Claims, 2 Drawing Figures

SPIN DRYING APPARATUS

BACKGROUND OF THE INVENTION

Field of the Invention

The present invention relates to spin drying apparatus for drying plate-like or wafer-like elements, such as semiconductor wafers, during the fabrication of semiconductor components. Wafers used for the manufacture of integrated circuits are subjected to a plurality of fabrication steps including the steps of etching, coating, doping, plating, etc. until the desired multilayered configuration is achieved. After many of the steps, it is desirable to clean the wafer in order to remove contaminants and other particles generated during the previous operation to prepare the wafer for the following operations. The wafers must be cleaned, often on both sides, generally employing a liquid cleaner. After the cleaning step the wafer must be dried in a manner which does not leave contaminants on the surface of the wafer. The cleanliness requirements for semiconductor wafers is such that even films or stains generated by the evaporation of the cleaning fluid can be deleterious.

Heretofore centrifugal drying of wafers has been considered the optimal method of drying semiconductor wafers because the centrifugal force helsp to overcome the surface tension and the resultant clinging of moisture around the edge of a wafer that can result from other forms of drying. Generally, spin drying has been accomplished in the prior art by a vacuum chuck which grips the wafer on the lower face thereof. It has been found that holding the wafer in this manner results in staining of that face of the wafer because the liquid trapped between the chuck and the wafer which either cannot be removed or, during spinning, leaks out from the chuck and is dried as its spreads over the wafer face leaving stains which are unacceptable.

Further, it has been found that the increasing wafer sizes now being utilized to improve semiconductor production efficiency are increasingly difficult to safely hold with vacuum chucks. Any imbalance with larger wafers quickly generate forces which overcome the vacuum force, resulting in the destruction of the wafer as it is flung from the chuck.

One solution for this problem has been to use a spin dryer arranged to grip the edge of the wafer during spinning. A representative type of spin dryer employing edge gripping is disclosed in IBM Technical Disclosure Bulletin, Vol. 18, No. 6 of November 1975 at pages 1979 and 1980. This device includes a plurality of radial arms extending outwardly from a central shaft which is coupled to a drive means for imparting spinning motion to the arms and a wafer held thereby. However, it has been found that with spin dryers of this type, employing radially extending arms to support the wafer at the edge thereof, the arms generates sufficient turbulent air flow that particulate contaminants (solid or liquid) may be picked up by the turbulent air and redeposited upon the cleaned and/or dried surface of the wafer. As the complexity of semiconductor chips increases, along with an ever-decreasing size for the respective components thereon, it becomes more and more important to ensure that the wafers are not only adequately cleaned and dried but are protected against recontamination by contaminants anywhere during the cleaning and drying cycle. It will thus be apparent that the recontamination of already cleaned and dried wafer surfaces by contaminants stirred up by the operation of the spin drying apparatus itself can be extremely unsatisfactory, reducing the yield of the semiconductor devices.

SUMMARY OF THE INVENTION

Accordingly, the present invention provides a spin drying apparatus for drying semiconductor wafers wherein the wafers are contacted only at the edge thereof by a plurality of radially extending arms and wherein means is provided for preventing the generation of a fan-like effect from the rotation of the arms during the spin drying step.

According to one aspect of the present invention, spin drying apparatus is provided for drying a plate-like element, such as a semiconductor wafer, which apparatus comprises a shaft arranged for rotary motion having a drive motor at one end and a rotating head assembly at the other end. The head assembly comprises a head element arranged coaxially at the end of the shaft, which assembly has a plurality of radial arms extending outwardly therefrom. A plurality of movable arms are pivotally connected one to each of the radial arms, and each have a plate-engaging portion. A biasing means is provided for biasing the plate-engaging portions of the movable arms to a plate-engaging position, and means is provided for moving the movable arms against the force of the biasing means to selectively move the plate-engaging portions from the plate-engaging position. A containment means closely surrounds the radially extending arms and includes a cover element for substantially eliminating the generation of air flow around the plate-like element by the rotation of said radially extending arms.

According to another aspect of the present invention, spin drying apparatus is provided for drying a semiconductor wafer and comprises a vertical hollow shaft, arranged for rotary motion and having a drive motor at the lower end and a rotating head assembly at the upper end thereof. The head assembly includes a hollow head element coaxially arranged at the upper end of the hollow shaft and a plurality of pairs of spaced radial arms extending outwardly therefrom. A plurality of T-shaped arms are pivotally connected, one between each pair of arms at the outer ends thereof. Each of the T-shaped arms has an axially extending wafer-engaging leg portion and another leg portion extending radially between the pairs of radial arms into said head element. An actuating means is provided which includes an actuator rod disposed coaxially within the hollow shaft, as well as means in the head element for engaging the inner ends of the radially extending portions of the T-shaped arms. Means is provided for biasing the actuating means coaxially of the shaft towards the motor to move the wafer-engaging leg portions toward the center of the head assembly to a wafer-engaging position. Pin means is disposed through the lower end of the actuator rod, which pin means extends outwardly through the shaft and is attached to a collar which is engageable by a fork means disposed about the shaft. An actuator means is arranged to move the fork axially of the shaft to engage the collar and to move the actuating means upwardly against the force of the biasing means, thereby moving the wafer-engaging leg portions outwardly from the wafer-engaging position. A first containment means peripherally surrounds the rotating head assembly and has an open upper end with a diameter greater than the diameter of the rotating head assembly, This containment means has a downwardly and outwardly sloping intermediate portion adjacent the wafer-engaging leg portion of the T-shaped arms and a drain means is disposed in the lower portion thereof. A second containment means is closely and stationarily disposed about the rotating arms and is spaced inwardly from the lower portion of the first containment means. The second containment means terminates at an upper end just above the pivotal connection between the arms of the head assembly. A cover element is provided for the second containment means which is connected to and extends from the center of the head assembly outwardly beyond the axially extending wafer-engaging leg portions of the T-shaped arms and terminates in close proximity to the upper end of the second containment means. The second containment means and the cover element substantially prevent air flow around the wafer which would otherwise have been generated by the rotation of the head assembly. The T-shaped arms are provided with counterweights disposed on the opposite side of the pivotal connections from the wafer-engaging leg portions which provide a centrifugal force upon rotation of the head assembly that substantially equals or slightly exceeds the centrifugal force on the wafer-engaging leg portions during rotation. Thus, the centrifugal force of the counterweights tends to cause the wafer-engaging leg portions to grip the plate member. Means is also provided for elevating the rotating head assembly to a position wherein the wafer-engaging leg portions are disposed above the open upper end of the first containment means, and a first pair of nozzle means are arranged for directing a liquid onto both surfaces of the wafer during a first portion of the spin cycle while a second pair of nozzle means direct an inert gas onto both surfaces of the wafer during a second portion of the spin cycle.

Various means for practicing the invention and other features and advantages thereof will be apparent from the following detailed description of illustrative preferred embodiments of the invention, reference being made to the accompanying drawings.

DESCRIPTION OF THE PREFERRED EMBODIMENT

Figure 1:
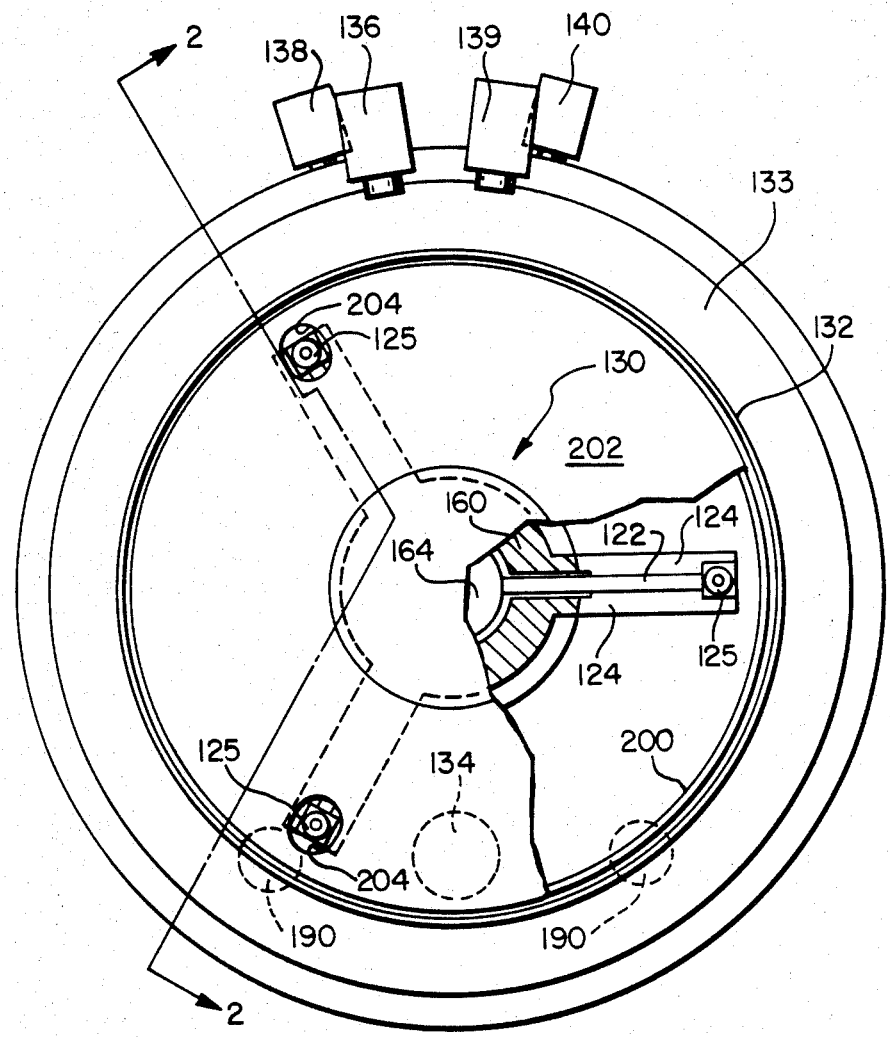
FIG. 1 is a plan view of a spin dryer according to the present invention.
Figure 2:
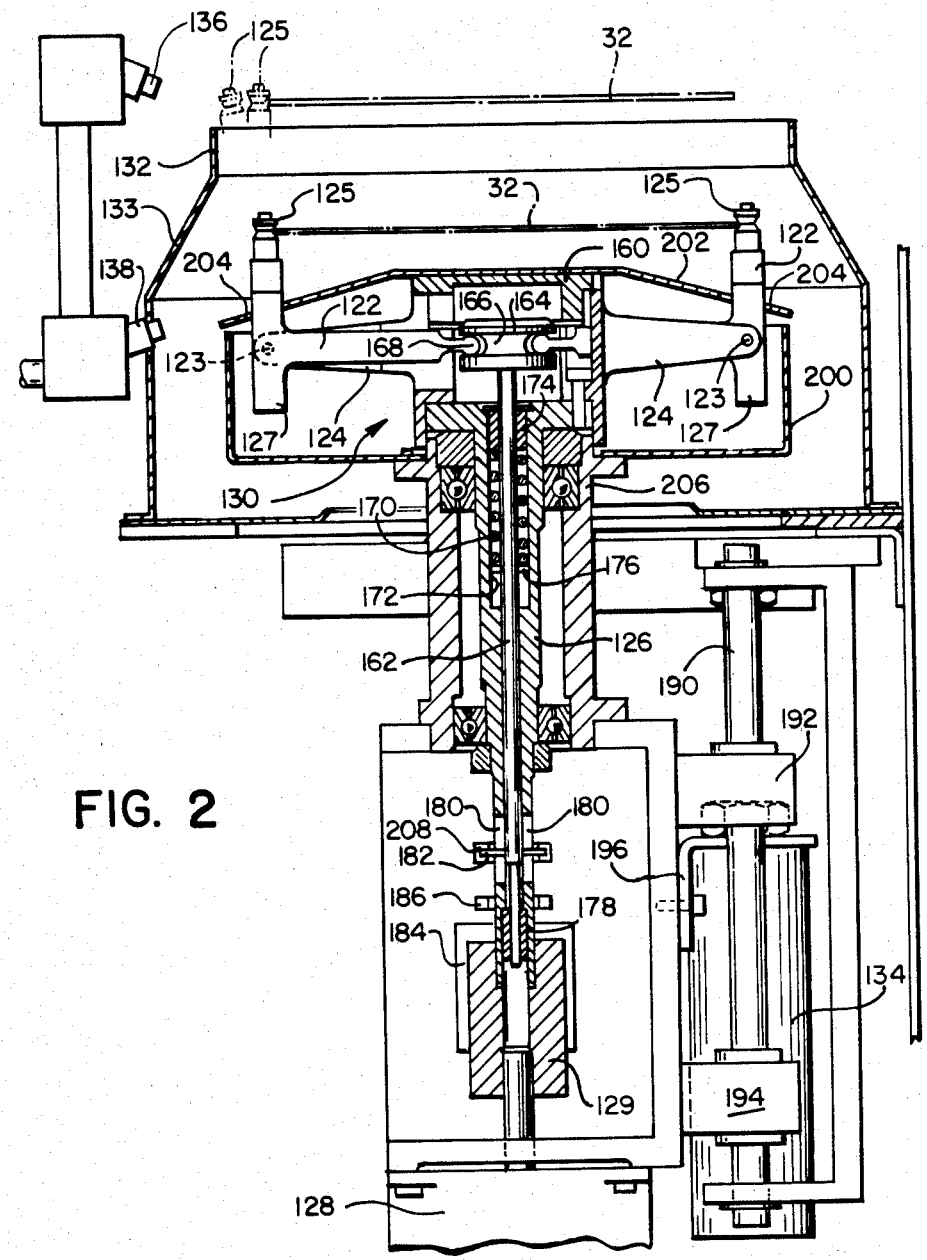
FIG. 2 is an elevation view, partly in section, taken along line 2—2 of FIG. 1.

Referring now to FIGS. 1 and 2 a preferred embodiment of the spin dryer apparatus is illustrated. The spin dryer comprises a rotating head assembly 130 disposed at the upper end of a substantially vertical hollow rotatable shaft 126. The rotating head assembly 130 includes a substantially cylindrical hollow head member 160 which is connected at the upper end of the shaft 126, and is provided with a plurality of pairs of spaced radially arms 124 extending outwardly therefrom. A plurality of T-shaped arms 122 are pivotally mounted at 123 between each pair of radial arms 124. Each of the T-shaped arms comprises an axially extending wafer-engaging leg portion having a wafer-engaging tip 125 at the outer end thereof, and a radially extending leg portion which extends into the head element 160. The wafer-engaging tip 125 at the outer end of the axially extending portion of the T-shaped arm is arranged to engage only the edge of a wafer to hold it in position for spin drying.

The shaft 126 is driven by a stepper motor 128 connected thereto by coupling 129 at the lower end thereof. The shaft 126 is provided with a central bore through which extends an actuator rod 162. The rod 162 has an enlarged upper end portion 164 within the cavity of head member 160. The end portion 164 is provided with an annular recess 166 which engages with the inner ends 168 of the radial portion of T-shaped arms 122. A biasing means, such as compression spring 170, is disposed around the upper end of rod 162 within an enlarged bore 172 in the upper end of the shaft 126. Spring 170 is compressed between a shoulder 174 at the upper end, and a collar 176 at the lower end connected to rod 162. Thus, spring 170 exerts a downward force on rod 162, to downwardly rotate the horizontal, radial portions of T-shaped arms 122, thereby drawing the wafer-engaging tips 125 toward the center of the head assembly into the wafer-engaging position. The lower end of the actuator rod 162 extends to the lower end of shaft 126 and terminates in sliding engagement with a bushing 178. Just above the lower end of rod 162, shaft 126 is provided with a pair of diametrically opposite slots 180 through the wall thereof. A horizontal pin 182 is connected through the rod 162 at this point and extends outwardly through the slots 180 in shaft 126 and connects to a collar 208.

Actuating means 184, either a solenoid or a pneumatic or hydraulic cylinder, is disposed on the far side of shaft 126 as illustrated in FIG. 2, with an operating shaft (not shown) extending upwardly therefrom parallel with shaft 126. At the upper end of the actuator shaft a fork 186 is provided having arms which extend around either side of shaft 126 just below collar 208. Upon operation of actuator 184, the fork is raised into engagement with collar 208, lifting rod 162 within shaft 126. As the upper end portion 164 is raised, the radially extending leg portions of T-shaped arms 122 are pivoted upwardly whereby the wafer-engaging tips 125 at the upper ends of the axially extending leg portions of arms 122 are rotated outwardly, thereby releasing their grip on a wafer, or in anticipation of the insertion of a new wafer into the spinner apparatus. When the actuator 184 is de-energized, the fork 186 is lowered, disengaging collar 208 and permitting spring 170 to force the rod 162 down, rotating the radially extending leg portions of arms 122 about the pivots 123 whereby the wafer-engaging tips 125 are again in wafer-engaging position.

The portions 127 of arms 122 below the pivot 123 are carefully designed to counterbalance and counteract any tendency of the upper portions of the arms to be pulled outward by centrifugal force during the spinning operation, with the possible resultant reduction in force gripping the wafer. Preferably the counterweights are so configured that the centrifugal force acting on the counterweight portion substantially equals or is slightly greater than the centrifugal force on the wafer-engaging tips 125, whereby the centrifugal force of the counterweight tends to cause the wafer-engaging tips to grip the wafer with at least as much, or slightly greater force than that provided by the spring 170 alone.

The spinner head assembly 130 is surrounded by a first containment means comprising a stationary cylindrical collector bowl 132 which has an open upper end with a diameter sufficiently greater than the diameter of the rotating head assembly that it may be moved upwardly therethrough to receive and discharge wafers, in a manner to be described hereinbelow. The cylindrical collector bowl 132 is provided with a downwardly and outwardly sloping intermediate portion 133 adjacent the wafer-engaging tips 125 of the T-shaped arms. The bowl is arranged to confine any moisture centrifugally removed from the wafer and to prevent its escape into the remainder of the apparatus surrounding the spin dryer, or redeposition onto the wafer surface. Thus any particles, solid or liquid, which are centrifugally discharged from a surface of the wafer strike the sloping shoulder portion 133 of the bowl and are deflected downwardly to the bottom of the collector bowl where they are removed by a suitable drain, not shown, which is provided in the bottom of the containment means.

As noted above, it has been found that with centrifugal spin dryers of the type disclosed herein, utilizing radial arms which grip the edges of the wafers, that problems have been encountered because of the air flow generated by the centrifugal pumping action of the rotating radial arms. It has been found that this air flow results in a turbulence around the wafer which entrains particulate liquid and/or solid material which may then be redeposited upon the wafer surface. With the present invention such air pumping and turbulent air flow is substantially eliminated by a second containment means comprising a stationary inner cylindrical shield member 200 which is disposed about the radially extending arms of the head assembly. The shield member is mounted to the stationary housing 206 for shaft 126 and is spaced inwardly from the lower portion of the cylindrical collector bowl 132. The upper end of the cylindrical shield member terminates just above the pivotal connection 123 between the radial arms 124 and the T-shaped arms 122. A cover element 202 for the second containment means is mounted on the head assembly 160 and extends from the center thereof outwardly beyond the axially extending wafer-engaging leg portions of the T-shaped arms and terminates in close proximity to the upper end of the shield member 200. The cover element 202 is arranged to rotate with the head assembly. As illustrated, the cover element 202 is provided with a sloping outer periphery and is provided with openings around the axially extending leg portions large enough to permit movement thereof for engaging and disengaging a wafer.

The entire spinner assembly, including the motor 128 is arranged to be lifted by a pneumatic or hydraulic cylinder 134 to lift the wafer-engaging tips 125 above the top of the collector bowl 132 for receiving and discharging wafers from the spin dryer apparatus. The spin dryer apparatus is supported and guided for a vertical movement by a pair of vertical guide rods 190. Two pair of bearing blocks 192 and 194 extend from the side of the spinner assembly and are provided with bearings which ride on the rods 190. The cylinder 134 is disposed between the rods and is connected by a bracket 196 to the side of the spinner assembly. The upper end of the piston rod (hidden behind rod 190) is fixed to the mounting frame for the spinner assembly. Thus, when the cylinder is actuated it is drawn up the piston rod, carrying the spinner assembly with it until the wafer engaging tips 125 reach the position illustrated in phantom, above the top edge of the collector bowl, where it is accessible to a wafer transfer mechanism for transfer either to or from the spin drying assembly.

Two pairs of spray nozzles 136, 138 and 139, 140 are provided to spray both surfaces of the wafer. The first pair of nozzles 136 and 138 are arranged to spray water onto both surfaces of the wafer to provide a final rinse before the drying cycle. The second pair of nozzles 139 and 140 spray both surfaces with an inert gas such as nitrogen to assist in the drying during the spin drying of the wafer. In a preferred operational cycle, the wafer is first spun at a slow speed while water is sprayed from nozzles 136 and 138 for a sufficient time to wash the wafer surface and then the speed of the motor is increased to centrifugally dry the wafer surfaces with the inert gas provided by nozzles 139 and 140 assisting in the drying process.

It will thus be seen that the present invention provides a spin drying apparatus which provides the advantages of gripping the wafer at the edges only and yet prevents the problem of recontamination by air pumped by the rotating radial arms.

The control system for the spin dryer takes advantage of the use of stepper motor 128 to control the spin cycle as well as the stopping position of the wafer-engaging arms. Thus, the stop position of the rotating head may be selected so that the wafer-engaging arms do not interfere with the wafer transfer mechanism transferring wafers to and from the spin drying mechanism.

The invention has been described with reference to specific embodiments and variations, but it should be apparent that other modifications and variations can be made within the spirit and scope of the invention, which is defined by the following claims.

What is claimed is:

1. Spin drying apparatus for drying a plate-like element, said apparatus comprising a shaft arranged for rotary motion and having a drive motor at one end and a rotating head assembly at the other end thereof, said head assembly comprising a head element coaxially arranged at said other end of said shaft and having a plurality of radial arms extending outwardly therefrom, a plurality of movable arms pivotally connected one to each of said radial arms and having a plate-engaging portion, biasing means for biasing said plate-engaging portions of said movable arms to a plate-engaging position, means for moving said movable arms against the force of said biasing means to move said plate-engaging portions thereof from said plate-engaging position, and containment means closely surrounding said radially extending arms including a cover element for substantially eliminating the generation of air flow around said plate-like element by the rotation of said radially extending arms.

2. The invention according to claim 1 wherein said movable arms are substantially T-shaped.

3. The invention according to claim 2 wherein each of said T-shaped arms have a first, generally axially extending leg portion and a second, generally radially extending leg portion, and wherein said axially extending-leg portions extend through said containment cover means.

4. The invention according to claim 3 wherein said movable arm is pivotally connected to said radial arm at the juncture of said axially extending leg portion and said radially extending leg portion.

5. The invention according to claim 3 wherein said axially extending leg portions of said movable arms includes said plate-engaging portions.

6. The invention according to claim 3 wherein said T-shaped arms include counterweights disposed on the opposite side of said pivotal connections from said axially extending leg portions, said counterweights providing a centrifugal force upon rotation of said head assembly that substantially equals or slightly exceeds the centrifugal force on said axially extending leg portions during rotation whereby the centrifugal force of said counterweights tends to cause the axially extending leg portions to grip said plate-like element.

7. Spin drying apparatus for drying a plate-like element, said apparatus comprising a shaft arranged for rotary motion and having a drive motor at one end and a rotating head assembly at the other end thereof, said head assembly comprising a head element coaxially arranged at said other end of said shaft and having a plurality of radial arms extending outwardly therefrom, a plurality of T-shaped arms pivotally connected one to each of said radial arms, said T-shaped arms each having an axially extending plate-engaging leg portion, and a radially extending leg portion that extends into said head element, actuating means including an actuator rod disposed within said shaft and means in said head element for engaging the inner ends of said T-shaped arms, biasing means for biasing said actuating means towards said motor to move said plate-engaging leg portions of said T-shaped arms to a plate-engaging position, means for moving said actuating means against the force of said biasing means to move said plate-engaging leg portions from said plate-engaging position, first containment means surrounding said rotating head assembly and having an open upper end, said first containment means having a downwardly and outwardly sloping intermediate portion adjacent said plate-engaging leg portion of said T-shaped arms, second containment means closely and stationarily disposed about said rotating arms and spaced inwardly from the lower portion of said first containment means, said second containment means terminating at an upper end just above said pivotal connection between said arms, a cover element for said second containment means connected to and extending from said head assembly outwardly beyond the axially extending plate-engaging leg portions of said T-shaped arms and terminating in close proximity to the upper end of said second containment means whereby said second containment means and said cover element substantially eliminate the generation of air flow around said plate-like element by the rotation of said head assembly, and means for elevating said rotating head assembly to a position wherein said plate-engaging leg portions are disposed above the open upper end of said first containment means.

8. The invention according to claim 7 wherein said T-shaped arms include counterweights disposed on the opposite side of said pivotal connections from said axially extending leg portions, said counterweights providing a centrifugal force upon rotation of said head assembly that substantially equals or slightly exceeds the centrifugal force on said axially extending leg portions during rotation whereby the centrifugal force of said counterweights tends to cause the axially extending leg portions to grip said plate-like element.

9. Spin drying apparatus for drying a semiconductor wafer, said apparatus comprising a vertical hollow shaft arranged for rotary motion and having a drive motor at the lower end and a rotating head assembly at the upper end thereof, said head assembly comprising a hollow head element coaxially arranged at the upper end of said hollow shaft and having a plurality of pairs of spaced radial arms extending outwardly therefrom, a plurality of T-shaped arms disposed one between each pair of arms and pivotally connected to the outer ends thereof, said T-shaped arms each having an axially extending wafer-engaging leg portion, the other leg of each of said T-shaped arms extending radially between said pairs of said radial arms into said head element, actuating means including an actuator rod disposed coaxially within said hollow shaft and means in said head element for engaging the inner ends of said T-shaped arms, biasing means for biasing said actuating means coaxially of said shaft towards said motor to move said wafer-engaging leg portions toward the center of said head assembly to a wafer-engaging position, pin means disposed through the lower end of said actuator rod and extending outwardly through said shaft and connected to a collar, fork means disposed about said shaft and arranged to selectively engage said collar, actuator means arranged to move said fork axially of said shaft to engage said collar and to move said actuating means upwardly against the force of said biasing means thereby moving said wafer-engaging leg portions outwardly from said wafer-engaging position, first containment means peripherally surrounding said rotating head assembly and having an open upper end with a diameter greater than the diameter of said rotating head assembly, said first containment means having a downwardly and outwardly sloping intermediate portion adjacent said wafer-engaging leg portion of said T-shaped arms, drain means disposed in the lower portion said first containment means, second containment means closely and stationarily disposed about said rotating arms and spaced inwardly from the lower portion of said first containment means, said second containment means terminating at an upper end just above said pivotal connection between said arms, a cover element for said second containment means connected to and extending from the center of said head assembly outwardly beyond the axially extending wafer-engaging leg portions of said T-shaped arms and terminating in close proximity to the upper end of said second containment means whereby said second containment means and said cover element substantially prevent air flow around said wafer generated by the rotation of said head assembly, said T-shaped arms being provided with counterweights disposed on the opposite side of said pivotal connections from said wafer-engaging leg portions, said counterweights providing a centrifugal force upon rotation of said head assembly that substantially equals or slightly exceeds the centrifugal force on said wafer-engaging leg portions during rotation whereby the centrifugal force of said counterweights tends to cause said wafer-engaging leg portions to grip said plate member, means for elevating said rotating head assembly to a position wherein said wafer-engaging leg portions are disposed above the open upper end of said first containment means, and a first pair of nozzle means for directing a liquid onto both surfaces of said wafer during a first portion of the spin cycle, and a second pair of nozzle means for directing an inert gas onto both surfaces of said wafer during a second portion of the spin cycle.

* * * * *